(12) United States Patent
Myung et al.

(10) Patent No.: US 11,043,449 B2
(45) Date of Patent: Jun. 22, 2021

(54) SEMICONDUCTOR PACKAGE

(71) Applicant: SAMSUNG ELECTRONICS CO., LTD., Suwon-si (KR)

(72) Inventors: Jun Woo Myung, Gyeonggi-do (KR); Ha Kyeong Lee, Gyeonggi-do (KR); Hyun Mi Kang, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/418,861

(22) Filed: May 21, 2019

(65) Prior Publication Data

US 2020/0168544 A1 May 28, 2020

(30) Foreign Application Priority Data

Nov. 23, 2018 (KR) .................. 10-2018-0146217

(51) Int. Cl.
| | |
|---|---|
| *H01L 23/522* | (2006.01) |
| *H01L 23/31* | (2006.01) |
| *H01L 23/00* | (2006.01) |
| *H01L 23/528* | (2006.01) |
| *H01L 23/48* | (2006.01) |

(52) U.S. Cl.
CPC ...... *H01L 23/5226* (2013.01); *H01L 23/3128* (2013.01); *H01L 23/3171* (2013.01); *H01L 23/481* (2013.01); *H01L 23/5283* (2013.01); *H01L 24/09* (2013.01); *H01L 24/17* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01)

(58) Field of Classification Search
CPC ............. H01L 23/5226; H01L 23/3178; H01L 23/481
See application file for complete search history.

(56) References Cited

U.S. PATENT DOCUMENTS

| | | | |
|---|---|---|---|
| 7,064,452 B2 * | 6/2006 | Huang | H01L 23/16 257/778 |
| 7,518,220 B2 * | 4/2009 | Kroehnert | H01L 23/3128 257/676 |
| 2017/0373029 A1 * | 12/2017 | Seol | H01L 23/3107 |

FOREIGN PATENT DOCUMENTS

KR  10-2018-0000652 A  1/2018

* cited by examiner

*Primary Examiner* — Marcos D. Pizarro
*Assistant Examiner* — Quinton A Brasfield
(74) *Attorney, Agent, or Firm* — Sughrue Mion, PLLC

(57) ABSTRACT

A semiconductor package includes a connection structure including an insulating layer, a redistribution layer disposed on the insulating layer, and a connection via penetrating through the insulating layer and connected to the redistribution layer, a semiconductor chip having an active surface on which connection pads are disposed and an inactive surface opposing the active surface, and having the active surface disposed on the connection structure to face the connection structure, and an encapsulant covering at least a portion of the semiconductor chip, wherein the semiconductor chip includes a groove formed in the active surface, and the groove has a shape in which a width of a region of at least a portion of an internal region located closer to a central portion of the semiconductor chip than the active surface is greater than a width of an entrance region.

20 Claims, 13 Drawing Sheets

I-I'

I-I'

I-I'

SEMICONDUCTOR PACKAGE

CROSS-REFERENCE TO RELATED APPLICATION(S)

This application claims benefit of priority to Korean Patent Application No. 10-2018-0146217 filed on Nov. 23, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing electrical connection structures outwardly of a region in which a semiconductor chip is disposed.

However, in a process of manufacturing the fan-out package, a defect that an encapsulant encapsulating the semiconductor chip bleeds into connection pads, or the like, has frequently occurred.

SUMMARY

An aspect of the present disclosure may provide a semiconductor package in which a bleeding defect due to an encapsulant may be suppressed and reliability of vias may be improved.

According to an aspect of the present disclosure, a semiconductor package may include a connection structure including an insulating layer, a redistribution layer disposed on the insulating layer, and a connection via penetrating through the insulating layer and connected to the redistribution layer, a semiconductor chip having an active surface on which connection pads are disposed and an inactive surface opposing the active surface, and having the active surface disposed on the connection structure to face the connection structure, and an encapsulant covering at least a portion of the semiconductor chip, wherein the semiconductor chip includes a groove formed in the active surface, and the groove has a shape in which a width of a region of at least a portion of an internal region located closer to a central portion of the semiconductor chip than the active surface is greater than a width of an entrance region.

The groove may be disposed between an edge of the semiconductor chip and the connection pads.

The groove may be continuously formed along an edge of the semiconductor chip.

The groove may include a plurality of grooves continuously formed, respectively, along an edge of a semiconductor chip and separated from each other.

The groove may be formed in the active surface of the semiconductor chip and may be recessed toward the inactive surface.

The groove may have a jar shape.

The groove may have a chamfered edge.

The semiconductor chip may include a passivation layer covering the active surface.

The groove may penetrate through the passivation layer.

A region of the groove penetrating through the passivation layer may have a predetermined width.

The semiconductor package may include a frame disposed on the connection structure and having a through-hole accommodating the semiconductor chip.

The encapsulant may fill the through-hole, and cover the inactive surface and side surfaces of the semiconductor chip.

The encapsulant may cover a portion of the active surface of the semiconductor chip.

The encapsulant may be filled in at least a portion of the groove.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
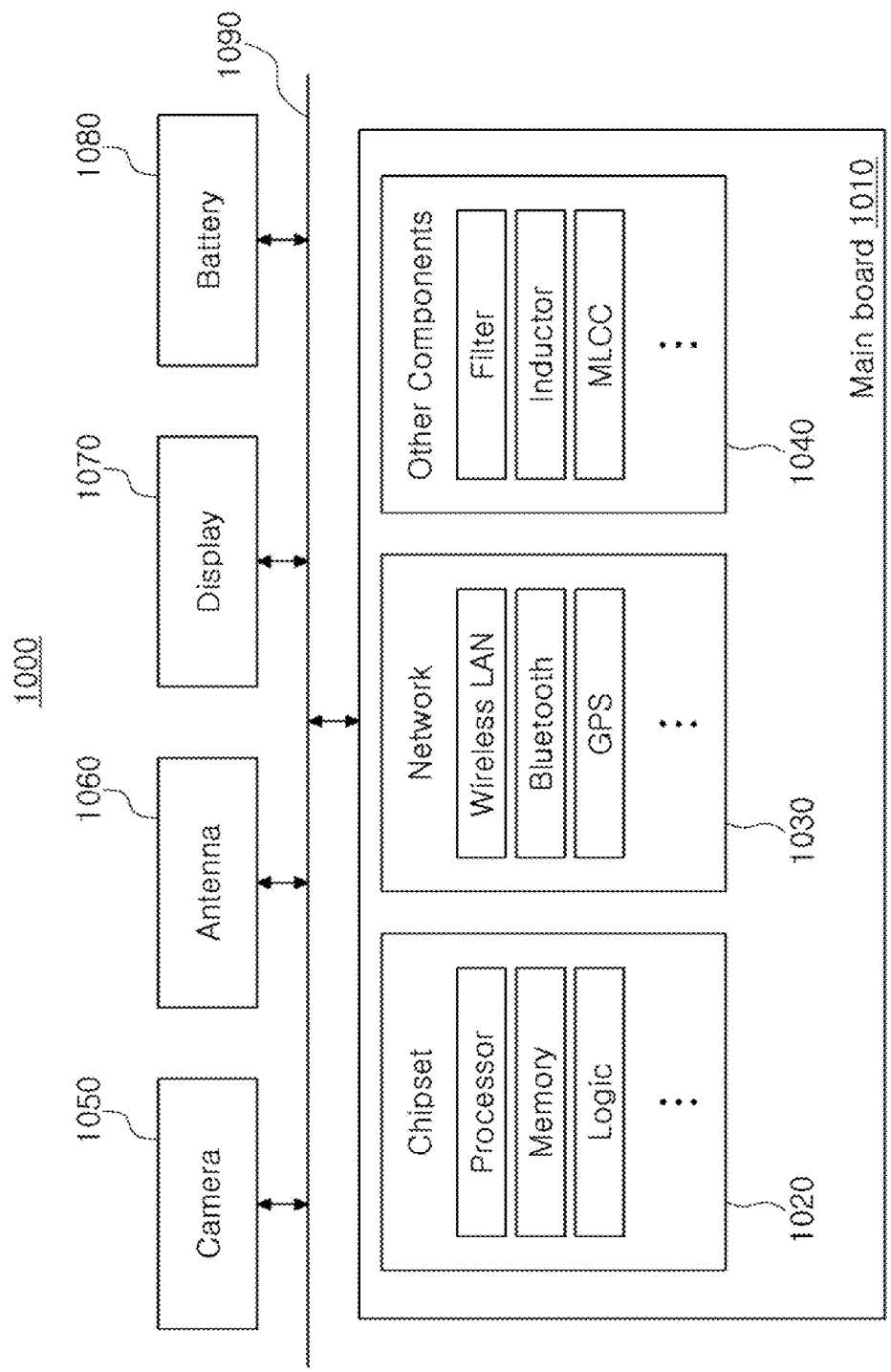
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
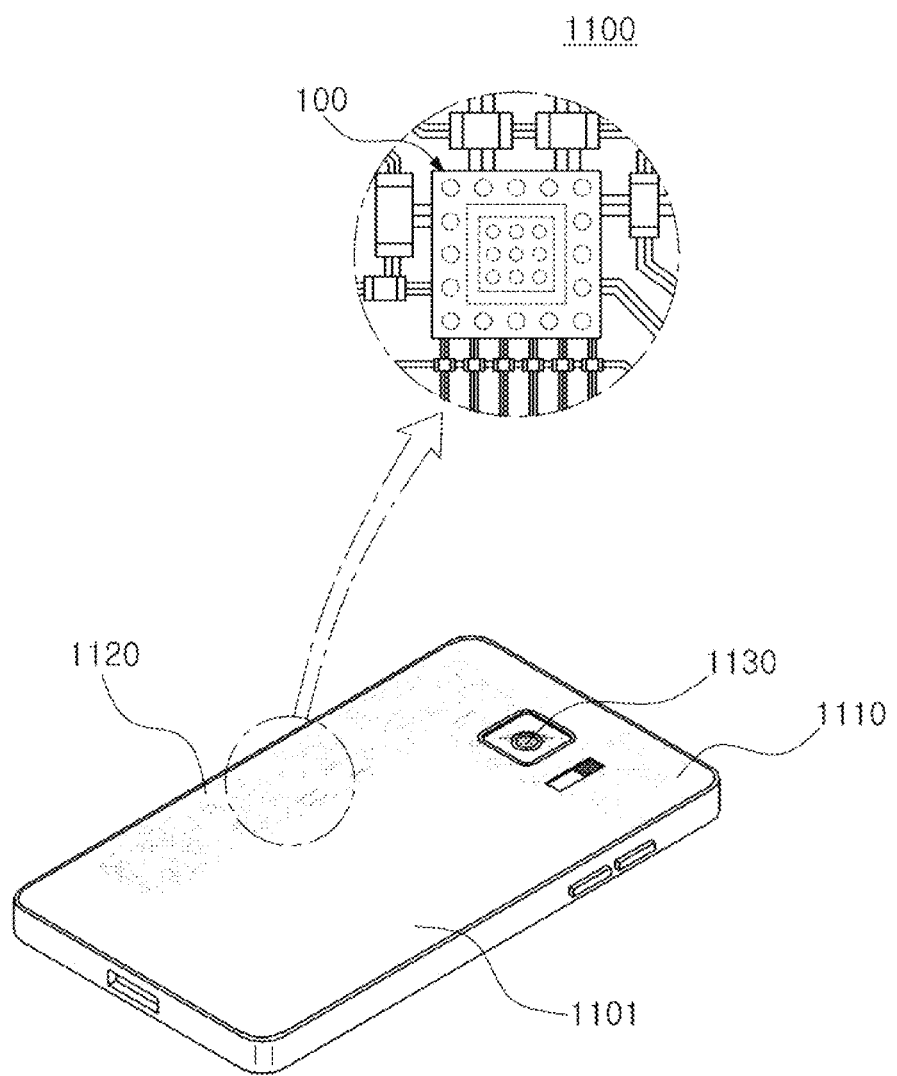
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a main board or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
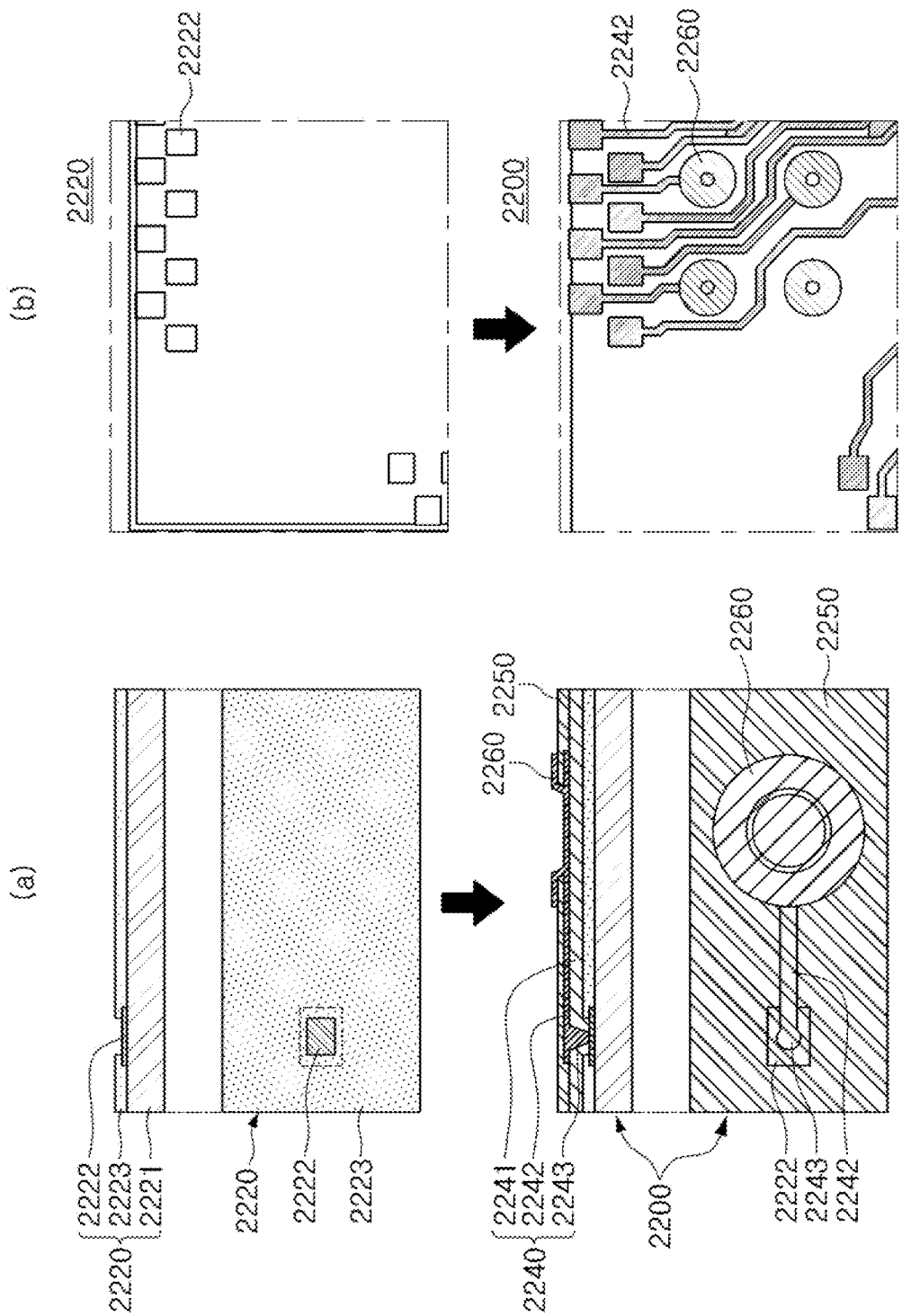
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
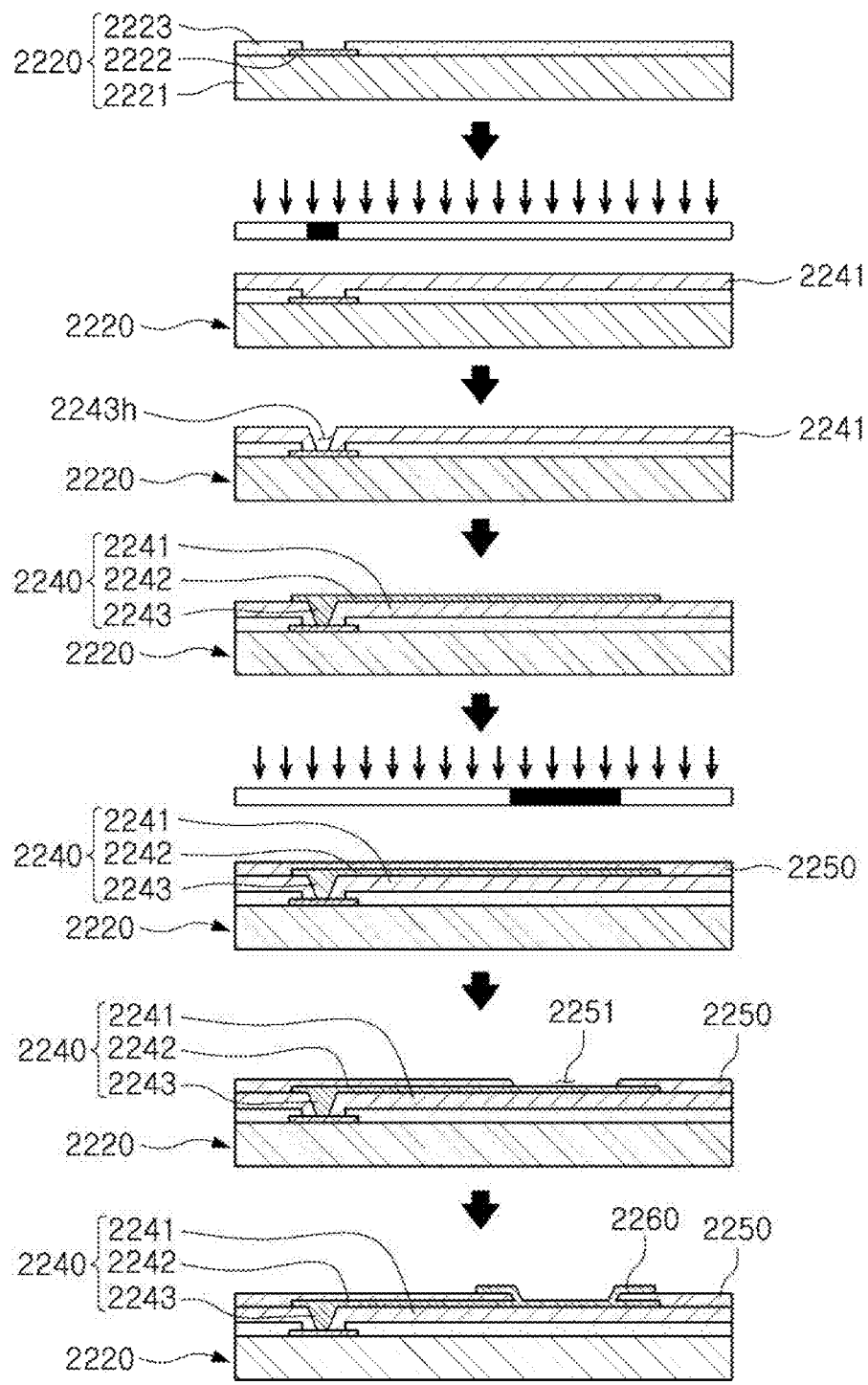
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
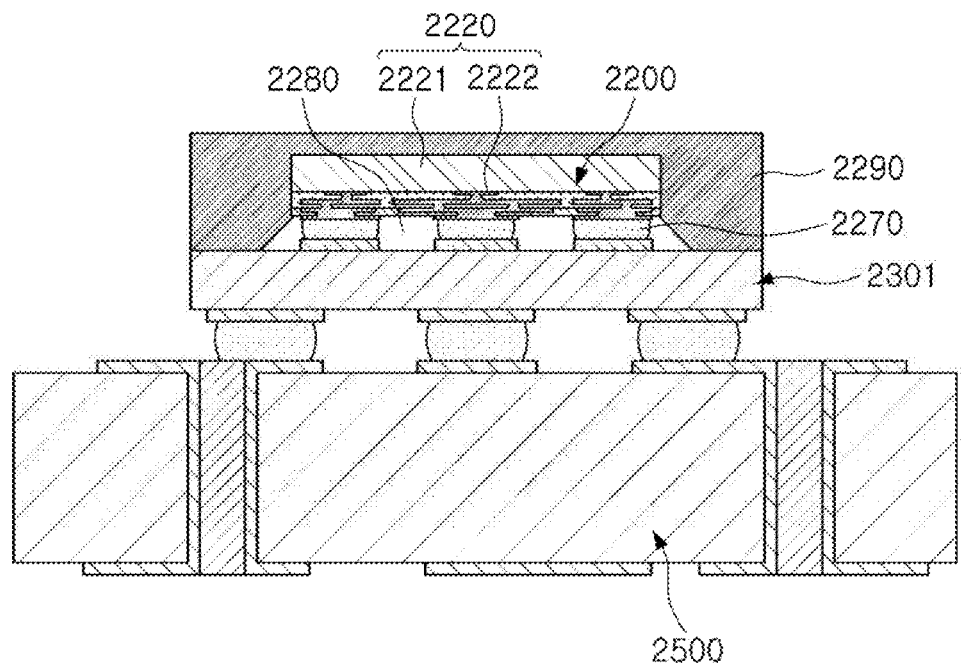
FIG. 5 is a schematic cross-sectional view illustrating a case in which a fan-in semiconductor package is mounted on a printed circuit board and is finally mounted on a main board of an electronic device.

FIG. 5 is a schematic cross-sectional view illustrating a case in which a fan-in semiconductor package is mounted on a printed circuit board and is finally mounted on a main board of an electronic device.

Figure 6:
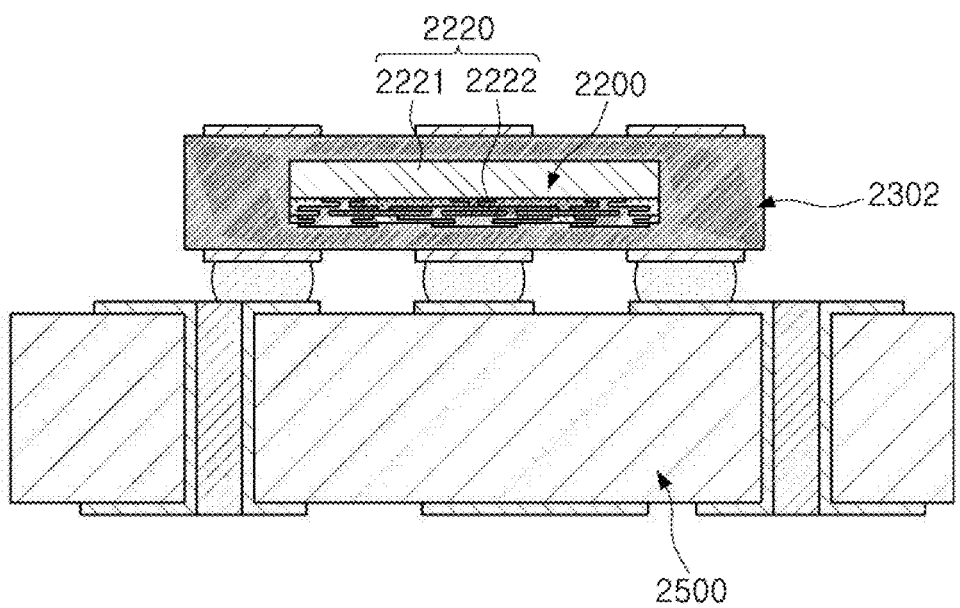
FIG. 6 is a schematic cross-sectional view illustrating a case in which a fan-in semiconductor package is embedded in a printed circuit board and is finally mounted on a main board of an electronic device.

FIG. 6 is a schematic cross-sectional view illustrating a case in which a fan-in semiconductor package is embedded in a printed circuit board and is finally mounted on a main board of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be finally mounted on a main board 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate printed circuit board and be then mounted on the main board of the electronic device through a packaging process or may be mounted and used on the main board of the electronic device in a state in which it is embedded in the printed circuit board.

Fan-out Semiconductor Package

Figure 7:
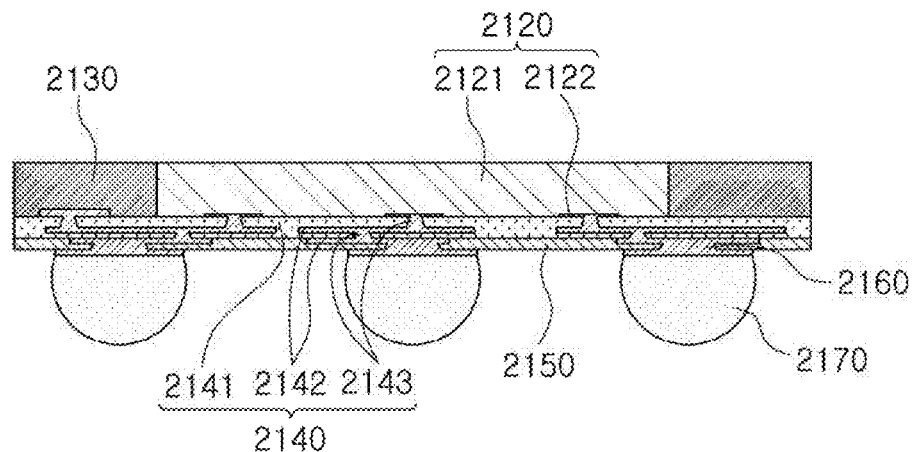
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. Here, a passivation layer 2150 may be further formed on the connection structure 2140, and underbump metal layers 2160 may be further formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2241, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate printed circuit board, as described below.

Figure 8:
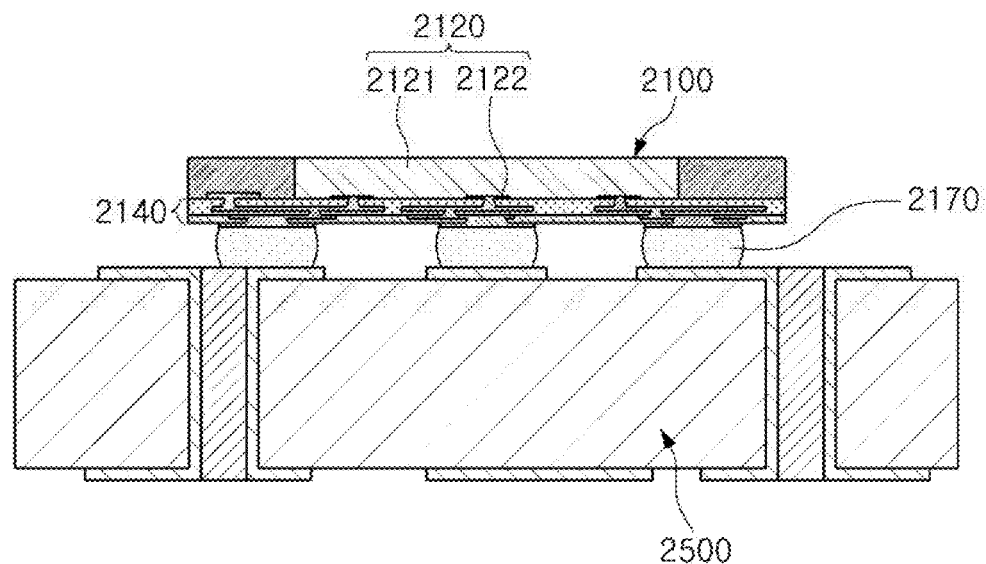
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a printed circuit board, or the like.

As described above, since the fan-out semiconductor package may be mounted on the main board of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

A semiconductor package in which a bleeding defect due to an encapsulant may be suppressed and reliability of vias may be improved will hereinafter be described with reference to the drawings.

Figure 9:
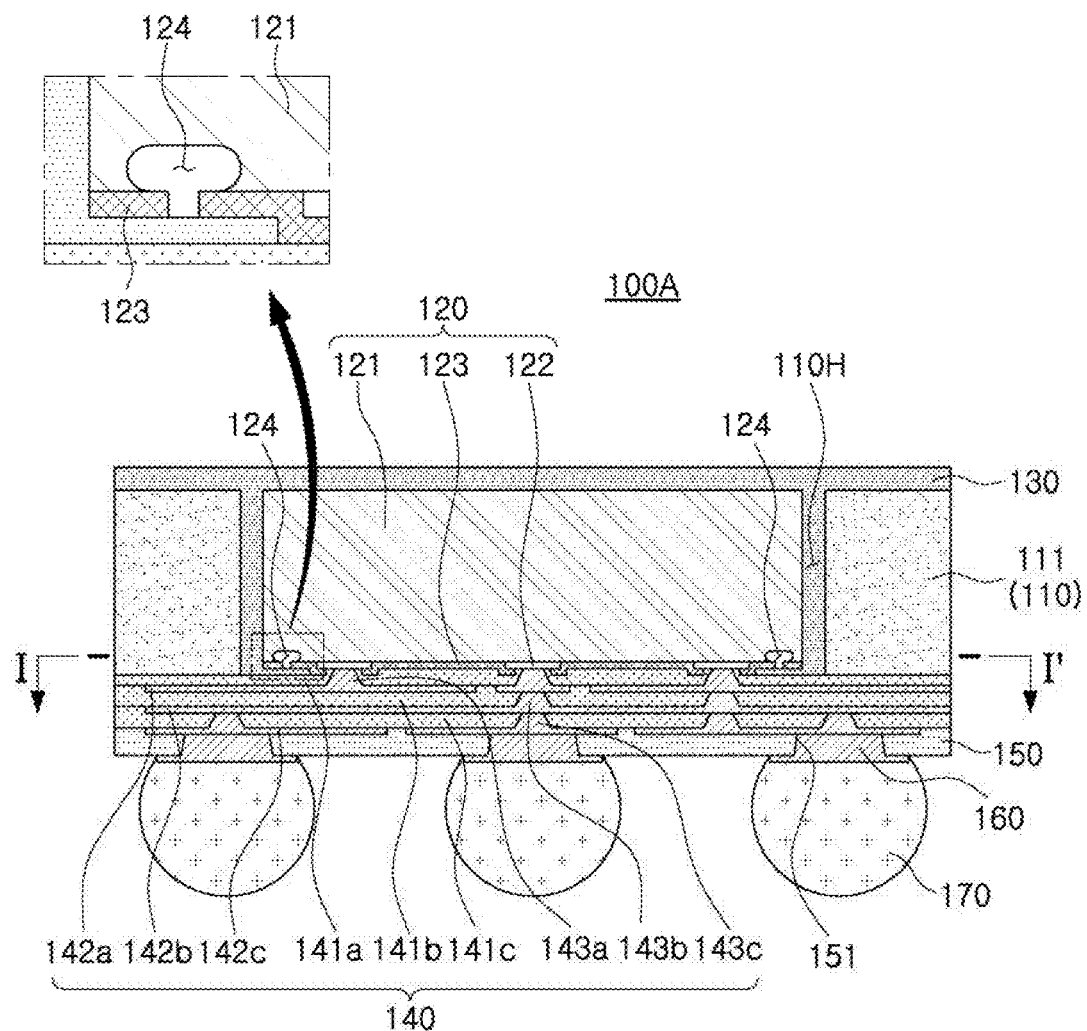
FIG. 9 is a schematic cross-sectional view illustrating an example of a semiconductor package.
Figure 11:
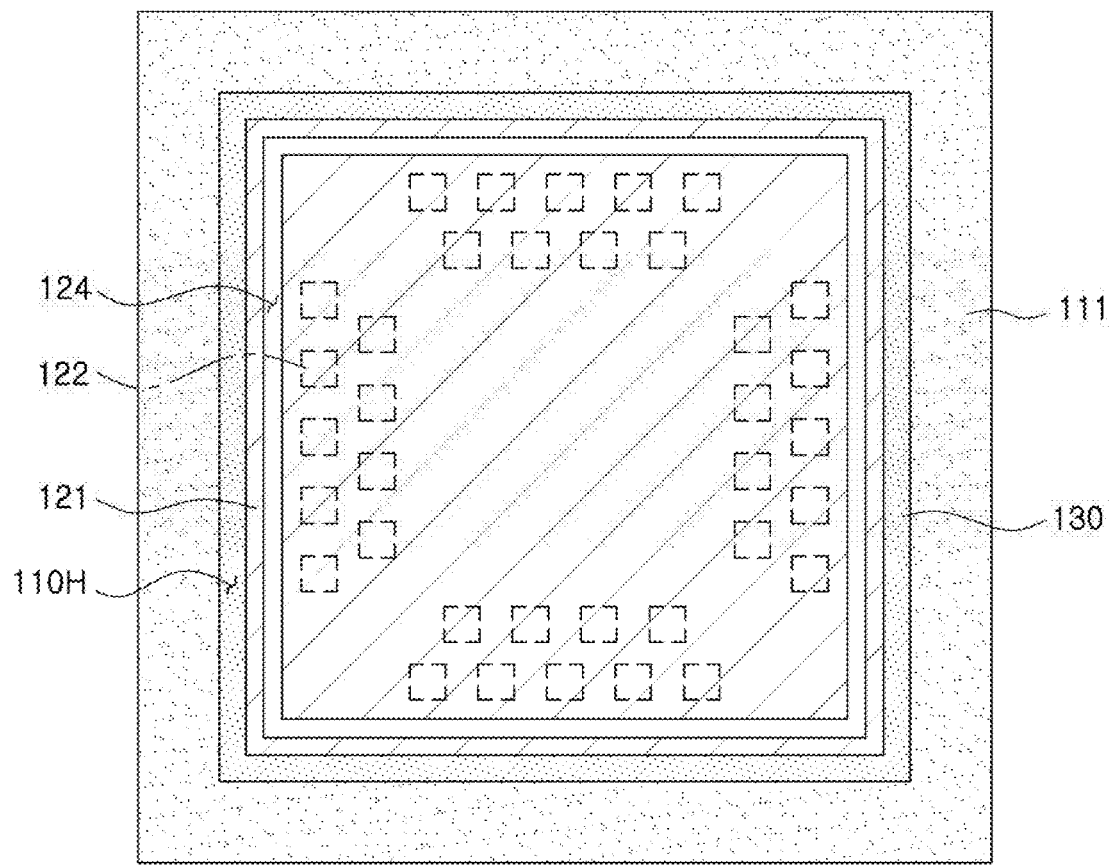
FIG. 11 is a schematic plan view taken along line I-I' of the semiconductor package of FIG. 9.
Figure 12A:
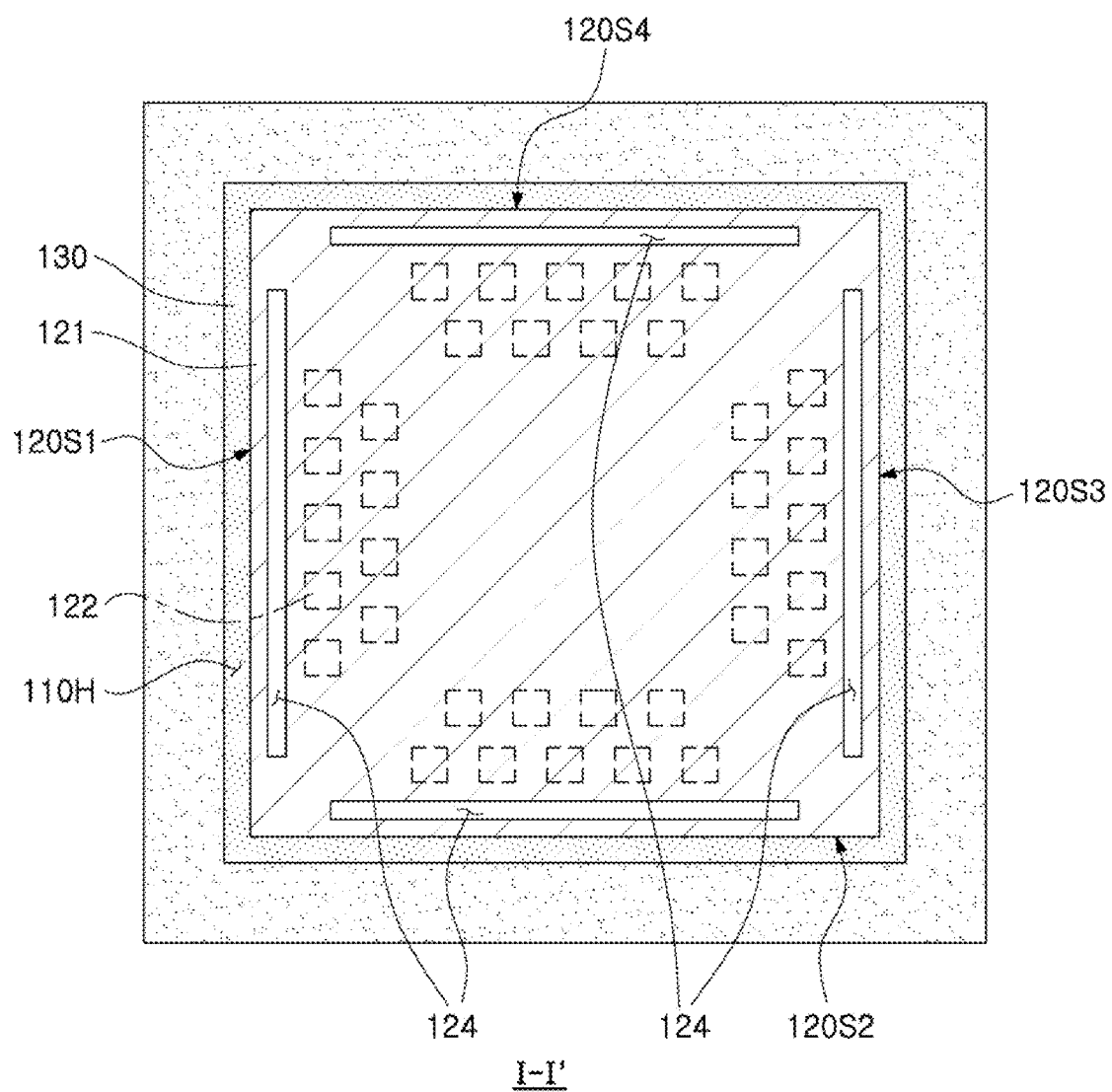
FIGS. 12A and 12B are other schematic plan views taken along line I-I' of the semiconductor package of FIG. 9.
Figure 12B:
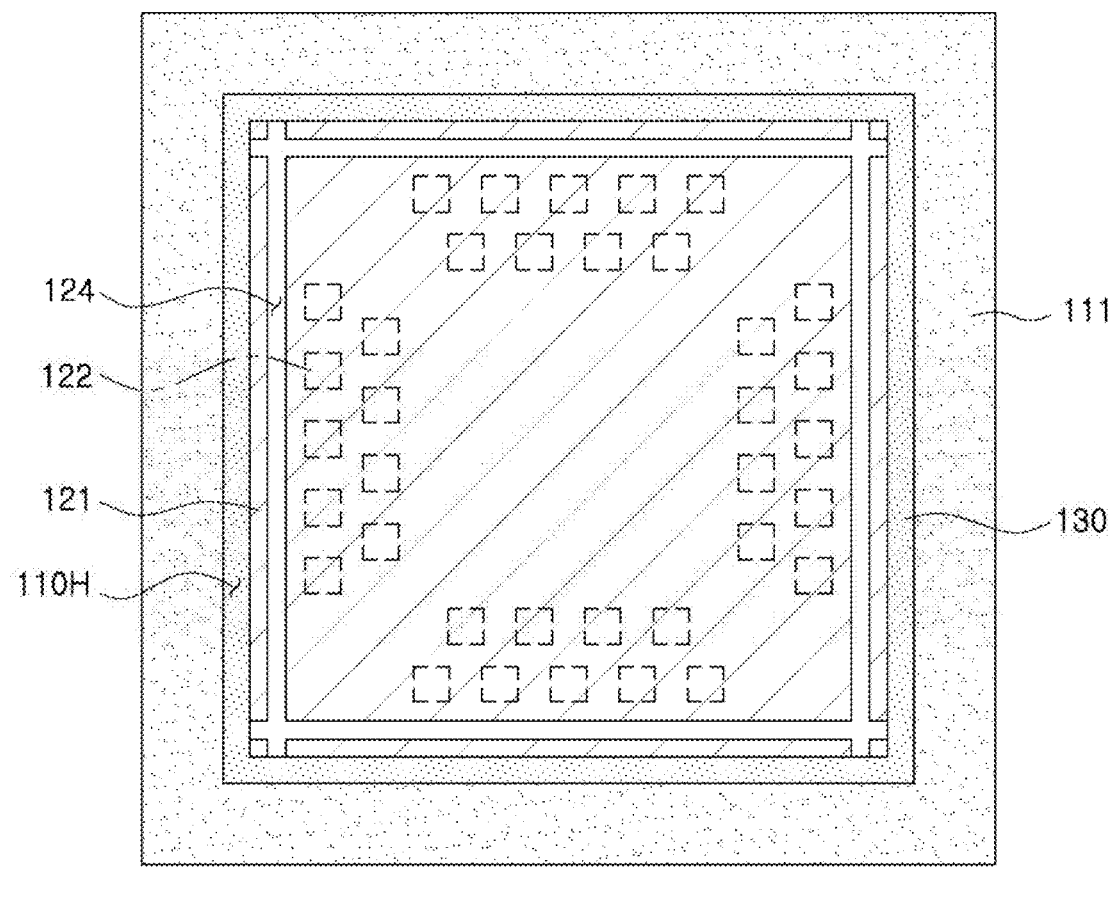
Figure 13:
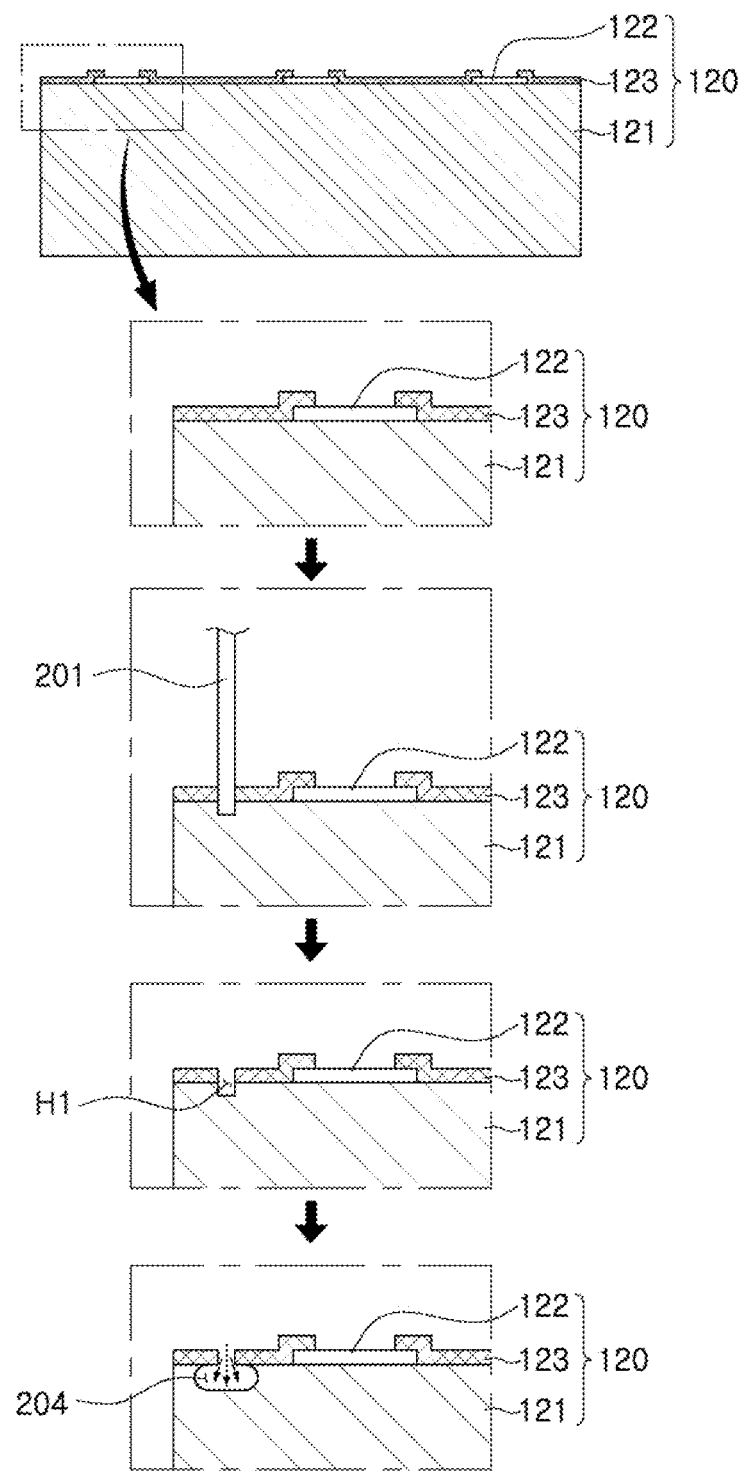
FIG. 13 illustrates an example of a manufacturing method of forming a groove of the semiconductor chip.

FIG. 9 is a schematic cross-sectional view illustrating an example of a semiconductor package. FIG. illustrates a groove of a semiconductor chip that may be used in the semiconductor package of FIG. 9. FIG. 11 is a schematic plan view taken along line I-I' of the semiconductor package of FIG. 9. FIGS. 12A and 12B are other schematic plan views taken along line I-I' of the semiconductor package of FIG. 9. In addition, FIG. 13 illustrates an example of a manufacturing method of forming a groove of the semiconductor chip.

Referring to FIG. 9, a semiconductor package 100A according to an example may include a connection structure 140, a semiconductor chip 120, an encapsulant 130, and the like as main components, and a groove 124 may be formed in an active surface of the semiconductor chip 120. In addition to the components described above, the semiconductor package 100A may further include a frame 110, a passivation layer 150, underbump metals 160, electrical connection metals 170, and the like.

The frame 110 may further improve rigidity of the semiconductor package 100A depending on certain materials, and serve to secure uniformity of a thickness of the encapsulant 130. When through-wirings, or the like, are formed in the frame 110 as in an exemplary embodiment to be described below, the semiconductor package 100A may be utilized as a package-on-package (POP) type package. According to the present exemplary embodiment, the frame 110 may have a through-hole 110H, and the semiconductor chip 120 may be disposed in the through-hole 110H. In this case, side surfaces of the semiconductor chip 120 may be surrounded by the frame 110. However, such a form is only an example and may be variously modified to have other forms, and the frame 110 may perform another function depending on such a form. The frame 110 may be omitted, if necessary, but it may be more advantageous in securing board level reliability when the semiconductor package 100A includes the frame 110.

The frame 110 may include an insulating layer 111. An insulating material may be used as the material of the insulating layer 111. In this case, the insulating material may be a thermosetting resin such as an epoxy resin, a thermoplastic resin such as polyimide, a resin in which the thermosetting resin or the thermoplastic resin is mixed with inorganic filler or is impregnated together with an inorganic filler in a core material such as a glass fiber (a glass cloth or a glass fabric), for example, prepreg, Ajinomoto Build-up Film (ABF), FR-4, Bismaleimide Triazine (BT), or the like. Such a frame 110 may serve as a support member.

The semiconductor chip 120 may be disposed on the connection structure 140 and may be an integrated circuit (IC) provided in an amount of several hundreds to several millions or more elements integrated in a single chip. In this case, the IC may be, for example, an application processor chip such as a central processor (for example, a CPU), a graphic processor (for example, a GPU), a digital signal processor, a cryptographic processor, a micro processor, a micro controller, or the like, but is not limited thereto. For example, the IC may also be a memory chip such as a power management IC (PMIC), a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an integrated circuit in a bare state in which a separate bump or wiring layer is not formed. However, the semiconductor chip 120 is not limited thereto, but may also be a packaged type IC if necessary. The integrated circuit may be formed on the basis of an active wafer. In this case, a base material of the body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a metal material such as aluminum (Al), or the like without being particularly limited. A passivation layer 123 opening the connection pads 122 may be formed on the body 121, and may be an oxide film, a nitride film, or the like, or a double layer of the oxide film and the nitride film. An insulating layer (not shown), and the like, may be further disposed in other required positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, the active surface of the semiconductor chip 120 may determine a positional relationship based on the lowest surface of the passivation layer 123.

The encapsulant 130 may cover at least a portion of the semiconductor chip 120, and may encapsulate the frame 110 and the semiconductor chip 120 as shown. In addition, the encapsulant 130 may fill at least a portion of the through-hole 110H, cover the inactive surface and the side surfaces of the semiconductor chip 120, and cover a portion of the active surface of the semiconductor chip 120. The encapsulant 130 may include an insulating material, and the insulating material may be a material including an inorganic filler and an insulating resin, for example, a thermosetting resin such as an epoxy resin, a thermoplastic resin such as polyimide, a resin having a reinforcing material such as inorganic filler included in the thermosetting resin and the thermoplastic resin, such as Ajinomoto Build up Film (ABF), FR-4, Bismaleimide Triazine (BT) resin, or the like. In addition, a molding material such as an epoxy molding compound (EMC) may be used, and a photo imagable dielectric material, that is, a photo imagable encapsulant (PIE) may also be used, if necessary. If necessary, a material in which an insulating resin such as a thermosetting resin or a thermoplastic resin is impregnated in inorganic filler and/or a core material such as a glass fiber (a glass cloth or a glass fabric) may also be used as the insulating material.

In the present exemplary embodiment, as shown in FIG. 9, the semiconductor chip 120 may include the groove 124 formed in the active surface thereof, and the groove 124 may have a shape in which a width of a region of at least a portion of an internal region located closer to the central portion of the semiconductor chip 120 than the active surface is greater than a width of an entrance region. Generally, in the semiconductor package, the semiconductor chip may be protected by covering an inactive surface and side surfaces of the semiconductor chip with an encapsulant. In this case, a material of the encapsulant before being cured may unintentionally bleed into the active surface of the semiconductor chip in an encapsulating process. Therefore, connection pads formed on the active surface may be polluted by the encapsulant. In this case, when a redistribution layer connected to the connection pads are formed in the subsequent process, an open defect of vias, a decrease in connectivity of the vias, electrical short-circuit, and the like, occur, such that reliability of the vias may be decreased.

Figure 10:
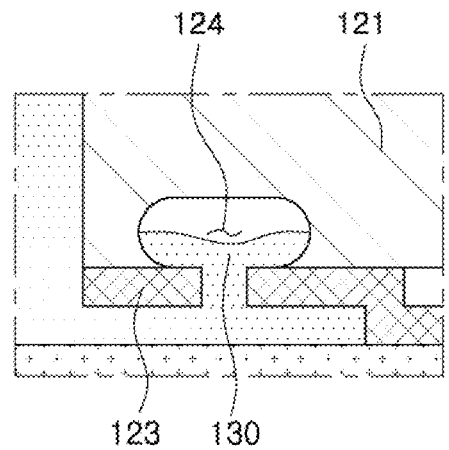
FIG. 10 illustrates a groove of a semiconductor chip that may be used in the semiconductor package of FIG. 9.

On the other hand, in the semiconductor chip 100A according to the exemplary embodiment, the groove 124 may be formed between the edge of the semiconductor chip 120 and the connection pads 122 on the active surface of the semiconductor chip 120 on which the connection pads 122 are formed. The groove 124 may be continuously formed along the edge of the semiconductor chip 120. That is, a plurality of connection pads 122 may be surrounded by one continuous groove 124. Therefore, even though a material of the encapsulant 130 before being cured permeates into the active surface of the semiconductor chip 120 on which the connection pads 122 are formed when the semiconductor chip 120 is encapsulated with the encapsulant 130, a phenomenon that the material of the encapsulant 130 bleeds up to the connection pads 122 may be blocked by the groove 124. Resultantly, a problem such as the decrease in the reliability of the vias, or the like, as described above may be prevented. Further, as in the present exemplary embodiment, when the groove 124 is implemented in the shape in which the width of the internal region is greater than the width of the entrance region, the material of encapsulant 130 may be smoothly moved laterally from the entrance region of the groove 124. The entrance region may be disposed between the internal region and the connection structure 140. Therefore, a problem in which the material of encapsulant 130 is accumulated in the entrance region of the groove 124 or escapes again from the groove 124 may be reduced, as the internal region may provide a larger volume to absorb the excessive encapsulant 130 intended to bleed up to the connection pads 122, thereby more effectively alleviating the bleeding. In this case, as shown in FIG. 10, the encapsulant 130 may be filled in at least a portion of the groove 124. In a case in which the encapsulant 130 does not completely fill the groove 124, a void and the encapsulant 130 may coexist in the groove 124.

Figure 14:
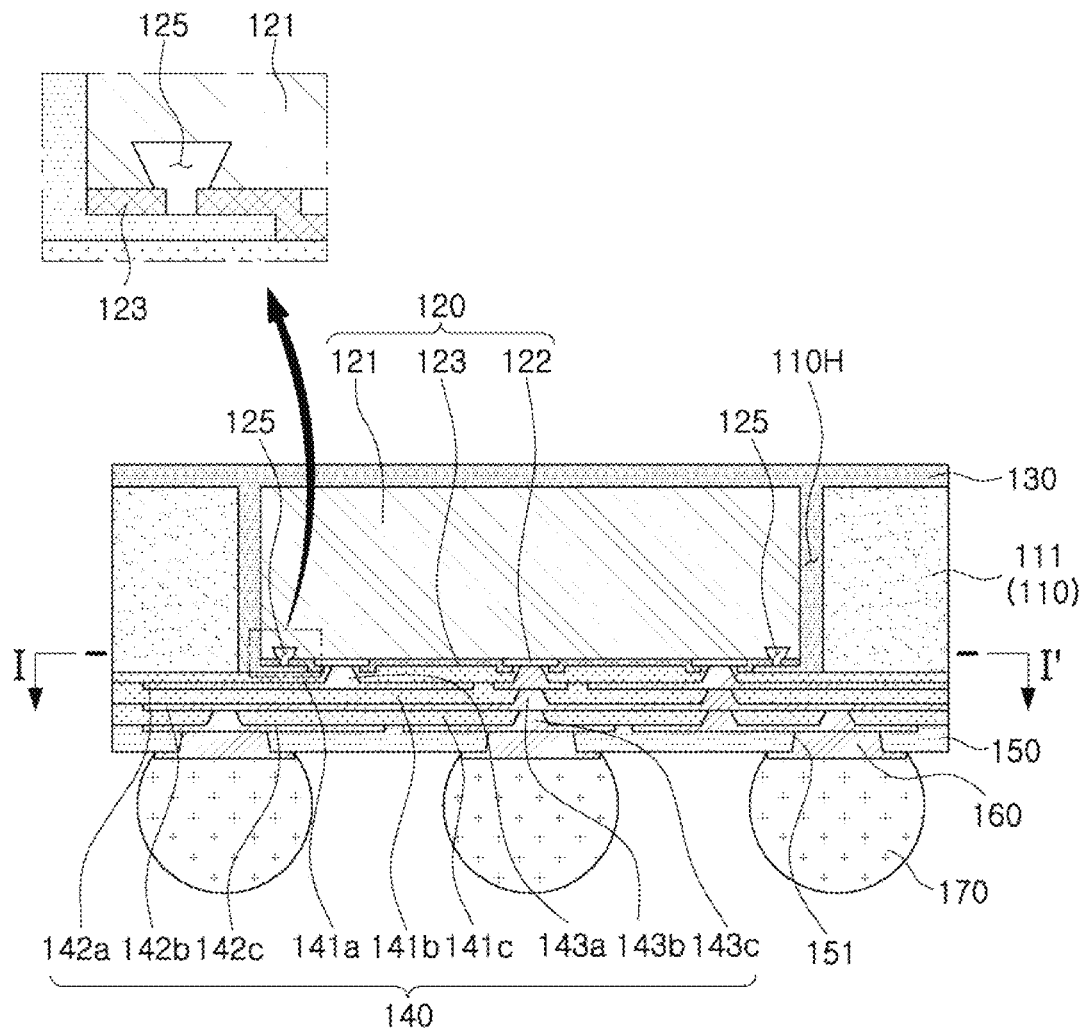
FIGS. 14 through 16 illustrate a semiconductor package according to a modified example.

In addition, in a case in which the groove 124 is continuously formed along the edge of the semiconductor chip 120 as shown in FIG. 11, a space into which the material of the encapsulant 130 may bleed may be completely blocked, such that a blocking effect may be particularly excellent. The groove 124 may be recessed from the active surface of the semiconductor chip 120 to the inactive surface thereof at a predetermined depth, and at least a portion of surfaces forming the groove 124 may be a curved surface. The groove 124 may have a jar shape. Unlike this, as in a modified example of FIG. 14, a groove 125 may have a chamfered edge.

The groove 124 may not have an integrated structure and may present as a plurality of separated regions. That is, as shown in FIG. 12A, the groove 124 may include a plurality of grooves 124 continuously formed, respectively, along a plurality of edges 120S1, 120S2, 120S3, and 120S4 of a semiconductor chip 120 and separated from each other. In more detail, the plurality of grooves 124 may include a plurality of grooves 124 continuously formed, respectively, along first to fourth edges 120S1, 120S2, 120S3, and 120S4 and separated from each other at corner portions of the semiconductor chip 120. As described above, also in a case in which the plurality of grooves 124 are continuously formed, respectively, along the edges 120S1, 120S2, 120S3, and 120S4 of the semiconductor chip 120, at least a plurality of connection pads 122 may be protected from bleeding of the material of the encapsulant 130. Alternatively, as shown in FIG. 12B, the groove 124 may have an integrated structure including a structure shown in FIG. 11 and additionally including extending portions extending along the structure shown in FIG. 11 to edges of the semiconductor chip 120. In this case, the groove 124 may include a plurality of sections extending continuously between edges of the semiconductor chips 120 and intersecting each other.

Meanwhile, the groove 124 may penetrate through the passivation layer 123, and in this case, a region of the groove 124 penetrating through the passivation layer 123 may have a predetermined width. The form described above may be implemented by an example of a manufacturing method illustrated in FIG. 13. Specifically, FIG. 13 illustrates an example of a process of forming the groove 124 in the semiconductor chip 120. First, a groove H1 may be formed in the active surface (an upper surface in FIG. 13) of the semiconductor chip 120 by a mechanical machining, and dicing equipment 201 may be used. Thereby, a groove having a predetermined width, that is, the above-mentioned groove H1 may be formed in the passivation layer 123 of the semiconductor chip 120, and may extend up to a body 121. However, a method of forming an opened region by patterning the passivation layer 123 without using the dicing equipment 201 may also be used. Thereafter, the groove H1 may be extended to form a groove 124 having a wider inner width, and for example, a plasma etching may be used.

Again, other components of the semiconductor package 100A will be described with reference to FIG. 9. The connection structure 140 may redistribute the connection pads 122 of the semiconductor chip 120. Several tens to several hundreds of connection pads 122 of the semiconductor chip 120 having various functions may be redistributed by the connection structure 140, and may be physically and/or electrically externally connected through the electrical connection metals 170 depending on the functions. To this end, the connection structure 140 may include redistribution layers 142a, 142b, and 142c. As an example, the connection structure 140 may include a first insulating layer 141a disposed on the frame 110 and the active surface of the semiconductor chip 120, a first redistribution layer 142a disposed on the first insulating layer 141a, a first connection via 143a connecting the first insulating layer 141a and the connection pads 122 of the semiconductor chip 120 to each other, a second insulating layer 141b disposed on the first insulating layer 141a, a second redistribution layer 142b disposed on the second insulating layer 141b, a second connection via 143b penetrating through the second insulating layer 141b and connecting the first and second redistribution layers 142a and 142b to each other, a third insulating layer 141c disposed on the second insulating layer 141b, a third redistribution layer 142c disposed on the third insulating layer 141c, and a third connection via 143c penetrating through the third insulating layer 141c and connecting the second and third redistribution layers 142b and 142c to each other. The first to third redistribution layers 142a, 142b, and 142c may be electrically connected to connection pads 122 of the semiconductor chip 120. However, the number of redistribution layers 142a, 142b, and 142c, insulating layers 141a, 141b, and 141c, and connection vias 143a, 143b, and 143c may be changed, if necessary.

An insulating material included in the insulating layers 141a, 141b, and 141c may also be, for example, a photo imagable dielectric material. When the insulating layers 141a, 141b, and 141c have photo imagable dielectric properties, the insulating layers 141a, 141b, and 141c may be formed to have a smaller thickness, and fine pitches of the connection vias 143a, 143b, and 143c may be achieved more easily. Each of the insulating layers 141a, 141b, and 141c may be a photo imagable dielectric insulating layer including an insulating resin and inorganic filler. When the insulating layers 141a, 141b, and 141c are multiple layers, the materials of the insulating layers 141a, 141b, and 141c may be the same as each other, and may also be different from each other, if necessary. When the insulating layers 141a, 141b, and 141c are the multiple layers, the insulating layers 141a, 141b, and 141c may be integrated with each other depending on a process, such that a boundary therebetween may also not be apparent. A larger number of insulating layers than those illustrated in the drawing may be formed.

The redistribution layers 142a, 142b, and 142c may serve to substantially redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of their corresponding layers. For example, the redistribution layers 142a, 142b, and 142c may include ground patterns, power patterns, signal patterns, and the like. Here, the signal patterns may include various signals except for the ground patterns, the power patterns, and the like, such as data signals, and the like. In addition, the redistribution layers 142a, 142b, and 142c may include via pad patterns, connection terminal pad patterns, and the like.

The connection vias 143a, 143b, and 143c may electrically connect the redistribution layers 142a, 142b, and 142c, the connection pads 122, or the like, formed on different layers to each other, resulting in an electrical path in the semiconductor package 100A. A material of each of the connection vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the connection vias 143a, 143b, and 143c may be completely filled with the conductive material, or the conductive material may be formed along a wall of each of the vias. In addition, each of the connection vias 143a, 143b, and 143c may have all of the shapes known in the related art, such as a tapered shape, a cylindrical shape, and the like.

The passivation layer 150 may protect the connection structure 140 from external physical or chemical damage. The passivation layer 150 may have openings 151 exposing at least portions of the redistribution layers 142a, 142b, and 142c of the connection structure 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as polyimide, a resin in which the thermosetting resin or the thermoplastic resin is mixed with inorganic filler, or impregnated together with inorganic filler in a core material such as a glass fiber (a glass cloth or a glass fabric), for example, prepreg, Ajinomoto Build-up Film (ABF), FR-4, Bismaleimide Triazine (BT), or the like. Alternatively, a solder resist may also be used.

The underbump metals 160 may improve connection reliability of the electrical connection metals 170 to improve board level reliability of the semiconductor package 100A. The underbump metals 160 may be connected to the redistribution layers 142a, 142b, and 142c of the connection structure 140 exposed through the openings 151 of the passivation layer 150. The underbump metals 160 may be formed in the openings 151 of the passivation layer 150 by the known metallization method using the known conductive material such as a metal, but are not limited thereto.

The electrical connection metals 170 may physically and/or electrically externally connect the semiconductor package 100A. For example, the semiconductor package 100A may be mounted on a main board of the electronic device through the electrical connection metals 170. Each of the electrical connection metals 170 may be formed of a conductive material, for example, a solder, or the like. However, this is only an example, and a material of each of the electrical connection metals 170 is not particularly limited thereto. Each of the electrical connection metals 170 may be a land, a ball, a pin, or the like. The electrical connection metals 170 may be formed as a multilayer or single layer structure. When the electrical connection metals 170 are formed as a multilayer structure, the electrical connection metals 170 may include a copper (Cu) pillar and a solder. When the electrical connection metals 170 are formed as a single layer structure, the electrical connection metals 170 may include a tin-silver solder or copper (Cu).

However, this is only an example, and the electrical connection metals 170 are not limited thereto.

The number, an interval, a disposition form, and the like, of electrical connection metals 170 are not particularly limited, but may be sufficiently modified depending on design particulars by those skilled in the art. For example, the electrical connection metals 170 may be provided in an amount of several tens to several thousands according to the number of connection pads 122, or may also be provided in an amount of several tens to several thousands or more or several tens to several thousands or less. When the electrical connection metals 170 are solder balls, the electrical connection metals 170 may cover side surfaces of the under-bump metals 160 extending onto one surface of the passivation layer 150, and connection reliability may be more excellent.

At least one of the electrical connection metals 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

Figure 15:
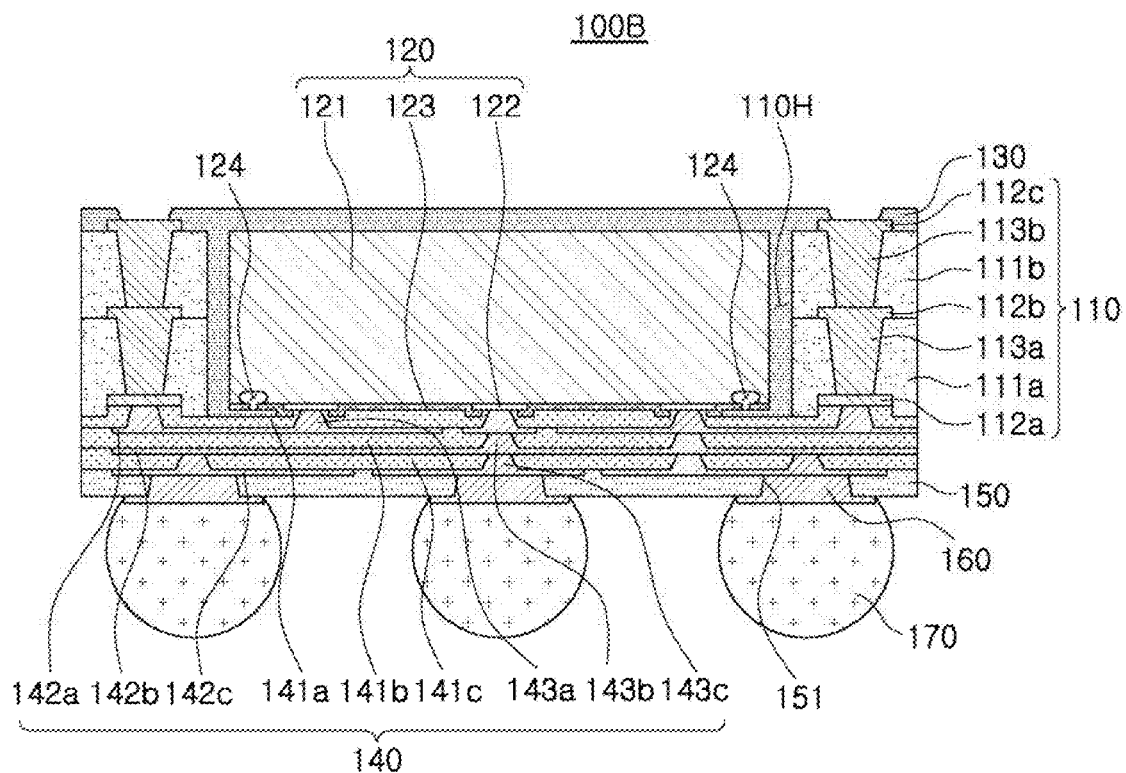
Figure 16:
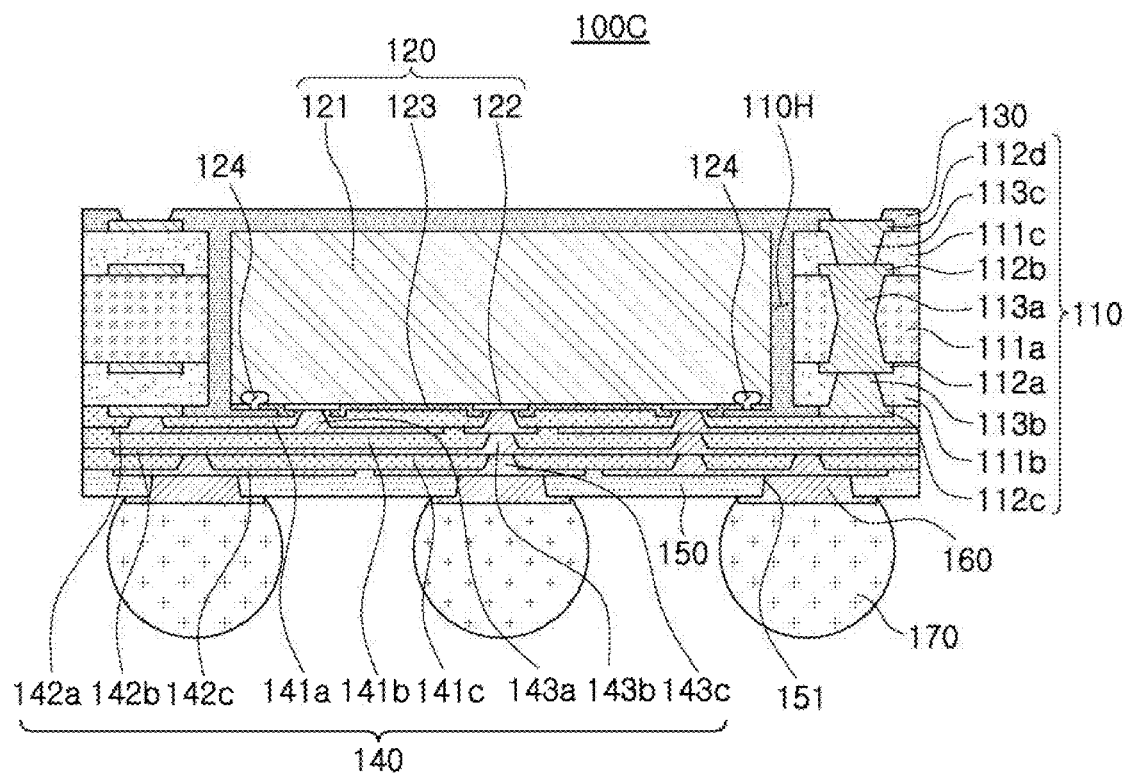

A semiconductor package according to another exemplary embodiment in the present disclosure will be described with reference to FIGS. 15 and 16, and the same portions as those of the exemplary embodiment described above will be omitted. In a semiconductor package 100B according to an exemplary embodiment of FIG. 15, a plurality of conductive vias serving to perform interlayer electricity conduction may be installed in the frame 110. In detail, the frame 110 may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to connection pads 122. The first and second wiring layers 112a and 112b and the second and third wiring layers 112b and 112c may be electrically connected to each other through first and second connection vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection structure 140 may thus become constant. That is, a difference between a distance from a first redistribution layer 142a of the connection structure 140 to a lower surface of the first insulating layer 111a and a distance from the first redistribution layer 142a of the connection structure 140 to the connection pads 122 of the semiconductor chip 120 may be smaller than a thickness of the first wiring layer 112a. Therefore, a high density wiring design of the connection structure 140 may be easy.

As shown, the lower surface of the first wiring layer 112a of the frame 110 may be disposed on a level above a lower surface of the connection pad 122 of the semiconductor chip 120. In addition, a distance between the first redistribution layer 142a of the connection structure 140 and the first wiring layer 112a of the frame 110 may be greater than that between the first redistribution layer 142a of the connection structure 140 and the connection pad 122 of the semiconductor chip 120. The reason is that the first wiring layer 112a may be recessed into the insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second wiring layer 112b of the frame 110 may be disposed between an active surface and an inactive surface of the semiconductor chip 120. The frame 110 may be formed at a thickness corresponding to that of the semiconductor chip 120. Therefore, the second wiring layer 112b formed in the frame 110 may be disposed on a level between the active surface and the inactive surface of the semiconductor chip 120.

Thicknesses of the wiring layers 112a, 112b, and 112c of the frame 110 may be greater than those of the redistribution layers 142a, 142b, and 142c of the connection structure 140. Since the frame 110 may have a thickness equal to or greater than that of the semiconductor chip 120, the wiring layers 112a, 112b, and 112c may be formed at larger sizes depending on a scale of the frame 110. On the other hand, the redistribution layers 142a, 142b, and 142c of the connection structure 140 may be formed at sizes relatively smaller than those of the wiring layers 112a, 112b, and 112c for thinness.

A material of each of the insulating layers 111a and 111b is not particularly limited. For example, an insulating material may be used as the material of the insulating layers 111a and 111b. In this case, the insulating material may be a thermosetting resin such as an epoxy resin, a thermoplastic resin such as polyimide, a resin in which the thermosetting resin or the thermoplastic resin is mixed with inorganic filler, or impregnated together with inorganic filler in a core material such as a glass fiber (a glass cloth or a glass fabric), for example, prepreg, Ajinomoto Build-up Film (ABF), FR-4, Bismaleimide Triazine (BT), or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground patterns, power pattern, signal patterns, and the like. Here, the signal patterns may include various signals except for the ground patterns, the power patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the frame 110. A material of each of the vias 113a and 113b may be a conductive material. Each of the vias 113a and 113b may be completely filled with a conductive material, or a conductive material may be formed along a wall of each of via holes. In addition, each of the vias 113a and 113b may have all of the shapes known in the related art, such as a tapered shape, a cylindrical shape, and the like. When holes for the first connection vias 113a are formed, some of the pads of the first wiring layer 112a may serve as a stopper, and it may thus be advantageous in a process that each of the first connection vias 113a has the tapered shape of which a width of an upper surface is greater than that of a lower surface. In this case, the first connection vias 113a may be integrated with pad patterns of the second wiring layer 112b. In addition, when holes for the second connection vias 113b are formed, some of the pads of the second wiring layer 112b may serve as a stopper, and it may thus be advantageous in a process that each of the second connection vias 113b has the tapered shape of which a width of an upper surface is greater than that of a lower surface. In this case, the second connection vias 113b may be integrated with pad patterns of the third wiring layer 112c.

Next, a semiconductor package 100C according to an exemplary embodiment of FIG. 16 will be described. In the semiconductor package 100C, a frame 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the frame 110 may include a large number of wiring layers 112a, 112b, 112c, and 112d, a connection structure 140 may be further simplified. Therefore, a decrease in a yield depending on a defect occurring in a process of forming the connection structure 140 may be suppressed. Meanwhile, the first to fourth wiring layers 112a, 112b, 112c, and 112d may be electrically connected to each other through first to third connection vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first connection vias 113a penetrating through the first insulating layer 111a may have a diameter greater than those of second and third connection vias 113b and 113c penetrating through the second and the third insulating layers 111b and 111c, respectively.

A lower surface of the third wiring layer 112c of the frame 110 may be disposed on a level below a lower surface of the connection pad 122 of the semiconductor chip 120. In addition, a distance between the first redistribution layer 142a of the connection structure 140 and the third wiring layer 112c of the frame 110 may be smaller than that between the first redistribution layer 142a of the connection structure 140 and the connection pad 122 of the semiconductor chip 120. The reason is that the third wiring layer 112c may be disposed in a protruding form on the second insulating layer 111b, resulting in being in contact with the connection structure 140. The first wiring layer 112a and the second wiring layer 112b of the frame 110 may be disposed between an active surface and an inactive surface of the semiconductor chip 120. The frame 110 may be formed at a thickness corresponding to that of the semiconductor chip 120. Therefore, the first wiring layer 112a and the second wiring layer 112b formed in the frame 110 may be disposed on the level between the active surface and the inactive surface of the semiconductor chip 120.

Thicknesses of the wiring layers 112a, 112b, 112c, and 112d of the frame 110 may be greater than those of the redistribution layers 142a, 142b, and 142c of the connection structure 140. Since the frame 110 may have a thickness equal to or greater than that of the semiconductor chip 120, the wiring layers 112a, 112b, 112c, and 112d may also be formed at larger sizes. On the other hand, the redistribution layers 142a, 142b, and 142c of the connection structure 140 may be formed at relatively small sizes for thinness.

In the present disclosure, terms "lower side", "lower portion", "lower surface", and the like, have been used to indicate a downward direction in relation to cross sections of the drawings, and terms "upper side", "upper portion", "upper surface", and the like, have been used to indicate a direction opposing the direction indicated by the terms "lower side", "lower portion", "lower surface", and the like. However, these directions are defined for convenience of explanation, and the claims are not particularly limited by the directions defined as described above, and the concept of the upper portion and the lower portion may be changed at any time.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the semiconductor package in which the bleeding defect due to the encapsulant may be suppressed and the reliability of the vias may be improved may be implemented.

While exemplary embodiments have been shown and described above, it will be apparent to those skilled in the art that modifications and variations could be made without departing from the scope of the present invention as defined by the appended claims.

What is claimed is:

1. A semiconductor package comprising:
a connection structure including an insulating layer, a redistribution layer disposed on the insulating layer, and a connection via penetrating through the insulating layer and connected to the redistribution layer;
a semiconductor chip having an active surface on which connection pads are disposed, an inactive surface opposing the active surface and a passivation layer disposed on the active surface, the active surface being disposed on and facing the connection structure to face the connection structure; and
an encapsulant covering at least a portion of the semiconductor chip,
wherein the semiconductor chip includes a groove formed in the active surface, the groove exposes a top surface and a side surface of the passivation layer, and the groove has a shape in which a width of a region of at least a portion of an internal region located closer to a central portion of the semiconductor chip than the active surface is greater than a width of an entrance region.

2. The semiconductor package of claim 1, wherein the groove is disposed between an edge of the semiconductor chip and the connection pads.

3. The semiconductor package of claim 1, wherein the groove is continuously formed along an edge of the semiconductor chip.

4. The semiconductor package of claim 1, wherein the groove includes a plurality of grooves continuously formed, respectively, along an edge of the semiconductor chip and separated from each other.

5. The semiconductor package of claim 1, wherein the groove is formed in the active surface of the semiconductor chip and is recessed toward the inactive surface.

6. The semiconductor package of claim 1, wherein the groove has a jar shape.

7. The semiconductor package of claim 1, wherein the groove has a chamfered edge.

8. The semiconductor package of claim 1, wherein the passivation layer covers the active surface.

9. The semiconductor package of claim 8, wherein the groove penetrates through the passivation layer, and
wherein the passivation layer is interposed between the groove and the encapsulant.

10. The semiconductor package of claim 9, wherein a region of the groove penetrating through the passivation layer has a predetermined width.

11. The semiconductor package of claim 1, further comprising a frame disposed on the connection structure and having a through-hole accommodating the semiconductor chip.

12. The semiconductor package of claim 11, wherein the encapsulant fills the through-hole, and covers the inactive surface and side surfaces of the semiconductor chip.

13. The semiconductor package of claim 12, wherein the encapsulant covers a portion of the active surface of the semiconductor chip.

14. The semiconductor package of claim 1, wherein the encapsulant is filled in at least a portion of the groove.

15. The semiconductor package of claim 14, wherein a void is disposed inside the groove.

16. The semiconductor package of claim 15, wherein the void is sealed by the encapsulant.

17. The semiconductor package of claim 1, wherein the groove includes a plurality of sections each extending continuously between edges of the semiconductor chip and intersecting each other.

18. A semiconductor package comprising:
a connection structure including an insulating layer, a redistribution layer disposed on the insulating layer, and a connection via penetrating through the insulating layer and connected to the redistribution layer;
a semiconductor chip having an active surface on which connection pads are disposed, an inactive surface opposing the active surface and a passivation layer disposed on the active surface, the active surface being disposed on and facing the connection structure; and
an encapsulant covering at least a portion of the semiconductor chip,
wherein the semiconductor chip includes a groove formed in the active surface that exposes a top surface and a side surface of the passivation layer.

19. The semiconductor package of claim 18, wherein the groove has an entrance region formed in the active surface and penetrating through the passivation layer, a top region, and a middle region interposed between the entrance region and the top region, wherein a first width of the middle region is greater than a second width of the entrance region and a third width of the top region.

20. A semiconductor package comprising:
a connection structure including an insulating layer, a redistribution layer disposed on the insulating layer, and a connection via penetrating through the insulating layer and connected to the redistribution layer;
a semiconductor chip having an active surface on which connection pads are disposed, an inactive surface opposing the active surface and a passivation layer disposed on the active surface, the active surface being disposed on and facing the connection structure, the semiconductor chip including a groove formed in the active surface that exposes a top surface and a side surface of the passivation layer and penetrates through the passivation layer, and the groove having an entrance region formed in the active surface and penetrating through the passivation layer, a top region, and a middle region interposed between the entrance region and the top region, wherein a first width of the middle region is greater than a second width of the entrance region and a third width of the top region; and
an encapsulant covering at least a portion of the semiconductor chip.

* * * * *